United States Patent

Xiang et al.

[11] Patent Number: 5,937,319
[45] Date of Patent: Aug. 10, 1999

[54] METHOD OF MAKING A METAL OXIDE SEMICONDUCTOR (MOS) TRANSISTOR POLYSILICON GATE WITH A SIZE BEYOND PHOTOLITHOGRAPHY LIMITATION BY USING POLYSILICIDATION AND SELECTIVE ETCHING

[75] Inventors: Qi Xiang, Santa Clara; Subash Gupta, San Jose; Ming-Ren Lin, Cupertino, all of Calif.

[73] Assignee: Advanced Micro Devices, Inc., Sunnyvale, Calif.

[21] Appl. No.: 08/961,828

[22] Filed: Oct. 31, 1997

[51] Int. Cl.[6] .......................... H01L 21/302; H01L 21/336
[52] U.S. Cl. .......................... 438/585; 438/596; 438/657; 438/683; 438/755
[58] Field of Search .................................... 438/197, 230, 438/303, 585, 595, 596, 647, 649, 655, 656, 657, 682, 684, 721, 745, 755, 947, FOR 351, FOR 353; 257/412; 748/DIG. 19, DIG. 147

[56] References Cited

U.S. PATENT DOCUMENTS

| | | | |
|---|---|---|---|
| 4,716,131 | 12/1987 | Okazawa et al. | 438/586 |
| 4,839,309 | 6/1989 | Easter et al. | 438/404 |
| 5,227,320 | 7/1993 | Johnson et al. | 438/304 |
| 5,231,042 | 7/1993 | Ilderem et al. | 438/533 |
| 5,670,794 | 9/1997 | Manning | 257/66 |
| 5,753,546 | 5/1998 | Koh et al. | 438/229 |
| 5,814,537 | 9/1998 | Maa et al. | 438/151 |

*Primary Examiner*—T. N. Quach
*Attorney, Agent, or Firm*—Fliesler, Dubb, Meyer & Lovejoy, LLP

[57] ABSTRACT

A method of fabricating a polysilicon gate 8 in a metal oxide semiconductor (MOS) transistor in an integrated circuit includes providing a metal layer 18, such as cobalt, on the sidewall 12 of the polysilicon gate 8, silicidizing the metal with the polysilicon in the polysilicon gate 8 to form a metal silicide sidewall 20, and removing the metal silicide sidewall 20 by etching.

58 Claims, 4 Drawing Sheets

METHOD OF MAKING A METAL OXIDE SEMICONDUCTOR (MOS) TRANSISTOR POLYSILICON GATE WITH A SIZE BEYOND PHOTOLITHOGRAPHY LIMITATION BY USING POLYSILICIDATION AND SELECTIVE ETCHING

TECHNICAL FIELD

The present invention relates to a method of fabricating a polysilicon gate of a metal oxide semiconductor (MOS) transistor, and more particularly, to a method of fabricating a polysilicon gate with a reduced gate size.

BACKGROUND ART

Metal oxide semiconductor (MOS) transistors have been extensively used in semiconductor integrated circuits and are well known in the electronics industry. A typical silicon MOS transistor generally comprises a polysilicon gate electrode, a gate oxide, a source and a drain. In order to improve the speed performance of MOS transistor devices, continuous efforts have been made by the industry to reduce the size of the MOS transistor devices. A reduction in device size requires a corresponding reduction in the length of the MOS transistor gate. MOS device technology has evolved in the past two decades with progressively reduced gate lengths achieved mainly by conventional device scaling methods. The feature size of a MOS transistor device has been progressively scaled down in an effort to increase the speed, performance and scale of integration.

However, conventional device scaling to reduce the gate length of a MOS transistor has its limitations. A major problem for further downward scaling of the MOS transistor gate length is the limitation of photolithographic technology. The smallest feature size of a MOS transistor gate that can be patterned by conventional photolithography is restricted by the optical phenomenon of diffraction. At the present time, ultraviolet (UV) or deep UV lights are used as light sources in photolithography processes. Because UV and deep UV lights have relatively short wavelengths, optical diffraction is reduced compared to that of visible lights, thereby enabling a photolithographic process to pattern device elements with a small feature size. However, even the photolithographic processes which utilize UV or deep UV lights are unable to effectively pattern a MOS transistor gate with a gate length of 0.1 $\mu$m or less.

A further reduction in the feature size of MOS transistor devices has been attempted to overcome the limitation of optical diffraction inherent in the photolithographic process. Photoresist trimming has been attempted to achieve a small feature size beyond the limitations of photolithography. However, it is very difficult to control the shape and the size of the MOS transistor gates by using photoresist trimming.

Therefore, there is a need for a polysilicon gate fabrication process for a further reduction of the gate length beyond the limitation of photolithography. Furthermore, there is a need to be able to control the shape and the size of the polysilicon gate while reducing the size of the gate.

DISCLOSURE OF THE INVENTION

The present invention satisfies these needs. In accordance with the present invention, a method of fabricating a polysilicon gate of a metal oxide semiconductor (MOS) transistor with a reduced gate length generally comprises the steps of:

(a) providing a polysilicon gate on a gate oxide layer, the polysilicon gate having a top and a sidewall;

(b) depositing a conformal layer of a metal on the polysilicon gate and the gate oxide layer;

(c) etching the conformal layer to leave a spacer layer of the metal on the sidewall of the polysilicon gate;

(d) silicidizing the metal spacer layer with the polysilicon to form a metal silicide sidewall surrounding the polysilicon gate; and (e) removing the metal silicide sidewall from the polysilicon gate, thereby reducing the size of the polysilicon gate.

In an embodiment, cobalt (Co) is used as the metal for the silicidation process. Co reacts with polysilicon to form cobalt disilicide ($CoSi_2$), which can be removed by a selective wet etch, such as boiling concentrated hydrochloric acid (HCl). The silicidation of cobalt can occur at a relatively low silicidation temperature of about 600° C.

In an additional embodiment, a cap layer of a silicon nitride oxide (SiON) material is deposited and etched on the top of the polysilicon gate prior to the depositing of the conformal layer. The SiON cap layer is later removed with a wet etch subsequent to the silicidation of cobalt.

Advantageously, the present invention provides a method of fabricating a polysilicon gate of a MOS transistor with a feature size smaller than that which can be achieved by existing photolithographic technology. Another advantage of the invention is that it provides controllability of the shape and the size of the polysilicon gate when the length of the gate is reduced by the silicidation process.

BRIEF DESCRIPTION OF THE DRAWINGS

The present invention will be described with respect to particular embodiments thereof, and references will be made to the drawings in which.

MODES FOR CARRYING OUT THE INVENTION

The present invention provides a method of making a polysilicon gate of a metal oxide semiconductor (MOS) transistor in an ultra large scale integration (ULSI) integrated circuit with a feature size smaller than that which can be achieved by existing photolithographic technology. Moreover, the method overcomes the controllability problem of photoresist trimming by using a self-limiting metal silicidation process with polysilicon and selective etching of metal silicide.

Figure 1:
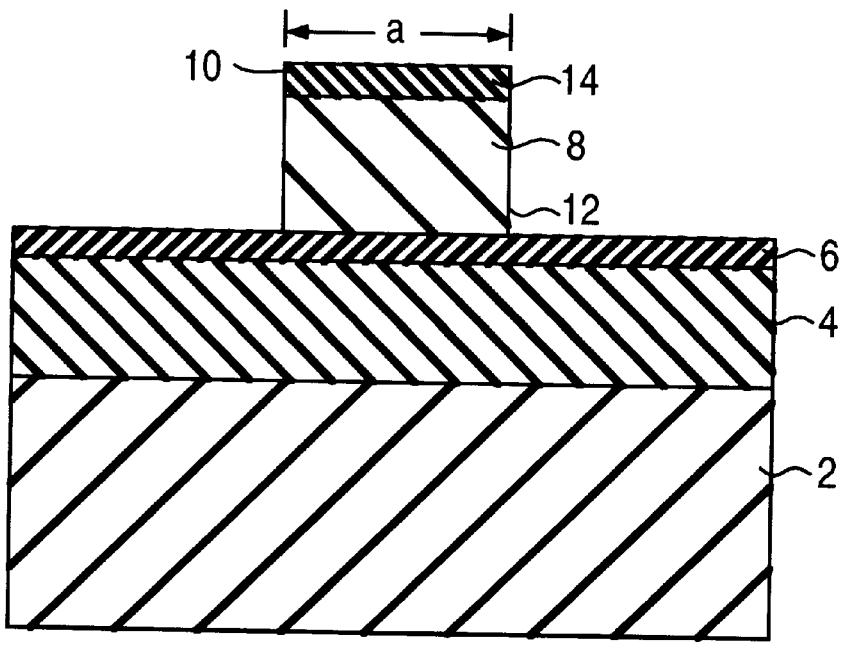
FIG. 1 is a sectional view of a portion of a metal oxide semiconductor (MOS) transistor showing a polysilicon gate and a cap layer prior to depositing a conformal metal layer.

FIG. 1 is a sectional view of a P$^+$-doped layer 2 and a P$^-$-doped layer 4 on the P$^+$-doped layer 2. The formation and doping of the layers 2 and 4 can be achieved by conventional fabrication technology which is apparent to a person skilled in the art. A gate oxide layer 6, which is usually a silicon oxide (SiO$_2$) layer, is deposited on the P$^-$-doped layer 4 by a conventional method of deposition which is apparent to a person skilled in the art. A polysilicon gate 8 is initially provided on the gate oxide layer 6 by a conventional method of photolithography that is apparent to a person skilled in the art. For example, the polysilicon gate 8 can be conventionally formed over the gate oxide layer 6 by patterning and etching a polysilicon layer on the gate oxide layer 6 using the gate oxide layer 6 as an etch stop. At this stage, the length a of the polysilicon gate 8 is not critical. A conventional lithography process employing an ultraviolet (UV) or deep UV light source can be used to pattern a photoresist which serves as an etch mask for the polysilicon gate 8 with a gate length in the range of 0.1–0.25 μm. However, with the present invention it is not necessary to push the limit of conventional photolithography on the size of the polysilicon gate 8. After the polysilicon layer is patterned and etched, a polysilicon gate 8 is formed on the gate oxide layer 6 with a top 10 and a sidewall 12.

In an embodiment, a cap layer 14, such as one made of a silicon nitride oxide (SiON) material, is provided on the top 10 of the polysilicon gate 8. The SiON cap layer 14 on the top 10 of the polysilicon gate 8 is conventionally used as a bottom anti-reflective coating (BARC) layer for lithography and a hard mask for etch as well. During the patterning of the polysilicon layer for making the polysilicon gate 8, the SiON cap layer 14 is patterned first on the polysilicon gate 8. During the etching of the polysilicon layer to form the polysilicon gate 8, portions of the polysilicon gate 8 not covered by the SiON cap layer 14 are removed by the etch. The SiON cap layer 14 therefore also serves to control the shape of the sidewall 12 of the polysilicon gate 8 during the etching process. The sidewall 12 should be as close to being vertical to the gate oxide layer 6 as possible. The method of providing the SiON cap layer 14 on the top 10 of the polysilicon gate 8 as a BARC layer for lithography is conventional and known to a person skilled in the art.

Figure 2:
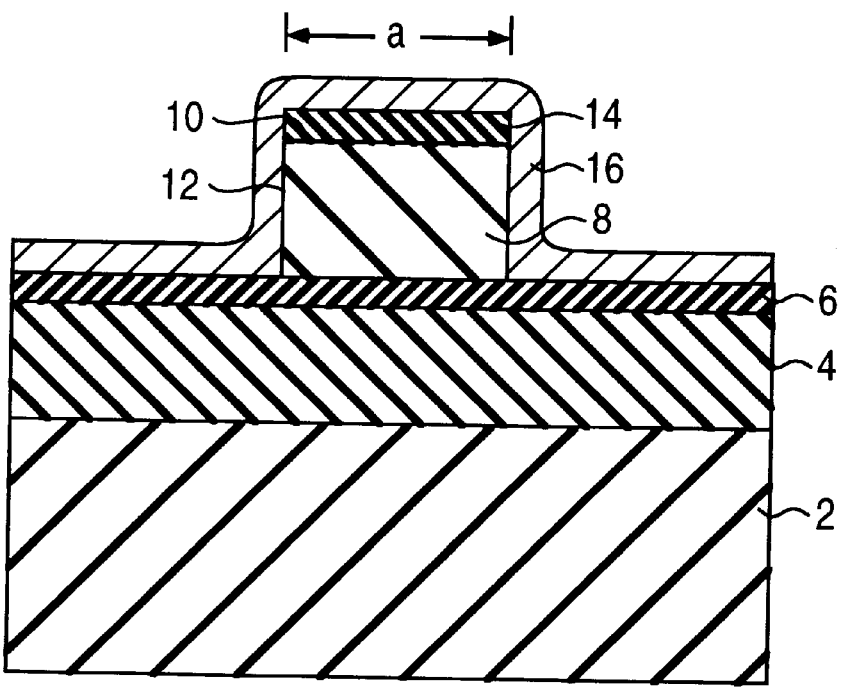
FIG. 2 is a sectional view of the MOS transistor portion of FIG. 1 with a conformal metal layer deposited on the polysilicon gate, the cap layer and the gate oxide layer.

In accordance with the present invention, a further reduction in the length a of the polysilicon gate 8 commences with the step of depositing a conformal layer 16 of a metal, such as cobalt (Co), conformally on the polysilicon gate 8, the gate oxide layer 6 and the cap layer 14, as shown in FIG. 2. The conformal metal layer 16 is in direct contact with exposed surface portions of the gate oxide layer 6, the SiON cap layer 14, and the sidewall 12 of the polysilicon gate 8. Although the use of Co as the material for the conformal layer 16 is described in detail, other metals such as nickel (Ni), titanium (Ti), chromium (Cr) and molybdenum (Mo) can also be used as the materials for the conformal layer 16. The conformal layer 16 can be deposited on the polysilicon gate 8, the gate oxide layer 6, and the SiON cap layer 14 by a chemical vapor deposition (CVD), to ensure uniformity of the thickness of the conformal layer 16. An advantage of the CVD is that it produces a conformal layer that substantially retains the shape of the surfaces upon which it is deposited.

Figure 3:
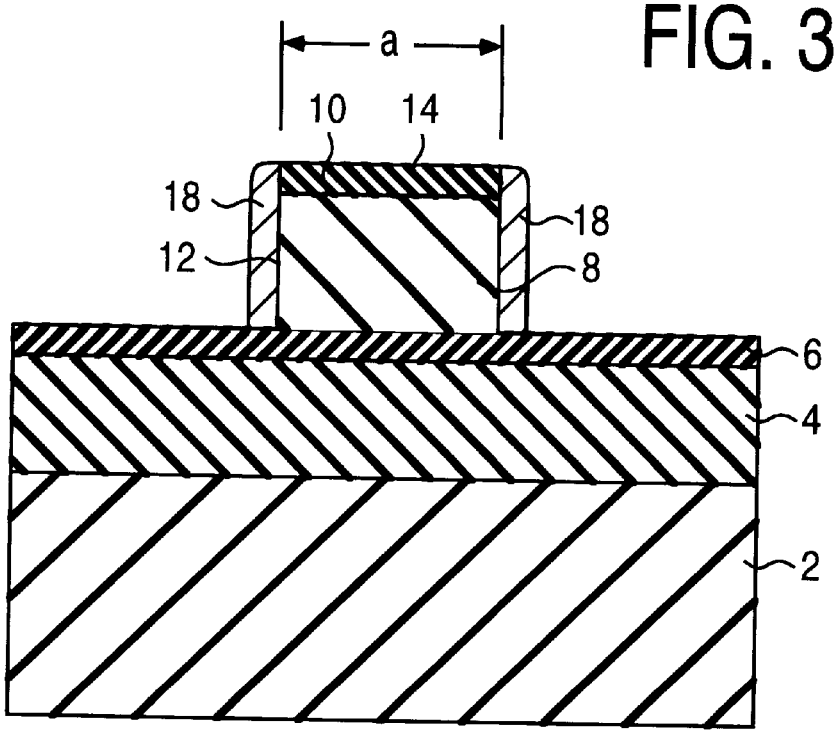
FIG. 3 is a sectional view of the MOS transistor portion of FIG. 2 with a spacer metal layer surrounding the sidewall of the polysilicon gate after the conformal layer covering the gate oxide layer and the cap layer has been removed.

After the deposition of the conformal metal layer 16, an etching is performed on the conformal layer 16 to remove portions of the conformal layer 16 on the gate oxide layer 6 and on the SiON cap layer 14, leaving only a spacer layer 18 of the metal on the sidewall 12 of the polysilicon gate 8, as shown in FIG. 3. A dry etching can be used to partially remove the conformal layer 16 to leave the spacer layer 18.

In a further embodiment, the conformal metal layer 16 is etched by a reactive ion etching (RIE) with an anisotropic etch to remove the conformal metal layer 16 except for a spacer metal layer 18 immediately surrounding the sidewall 12 of the polysilicon gate 8. RIE with an anisotropic etch is well suited for the etching of a conformal Co layer. An end point scheme can be utilized for the anisotropic etch, using the SiON cap layer 14 as an etch stop. Advantageously, since the SiON cap layer 14 covers only the top 10 of the polysilicon gate 8 and has the same length a as the polysilicon gate 8, the anisotropic etch can use the SiON cap layer 14 as an etch stop, thereby preserving the spacer layer 18 of Co on the sidewall 12 of the polysilicon gate 8, while removing the portions of the conformal Co layer 16 from the top of the SiON cap layer 14 and the top of the gate oxide layer 6. The portion of the conformal Co layer 16 on the top 10 of the SiON cap layer 14 can be slightly overetched so that it is removed completely from the cap layer 14.

Figure 4:
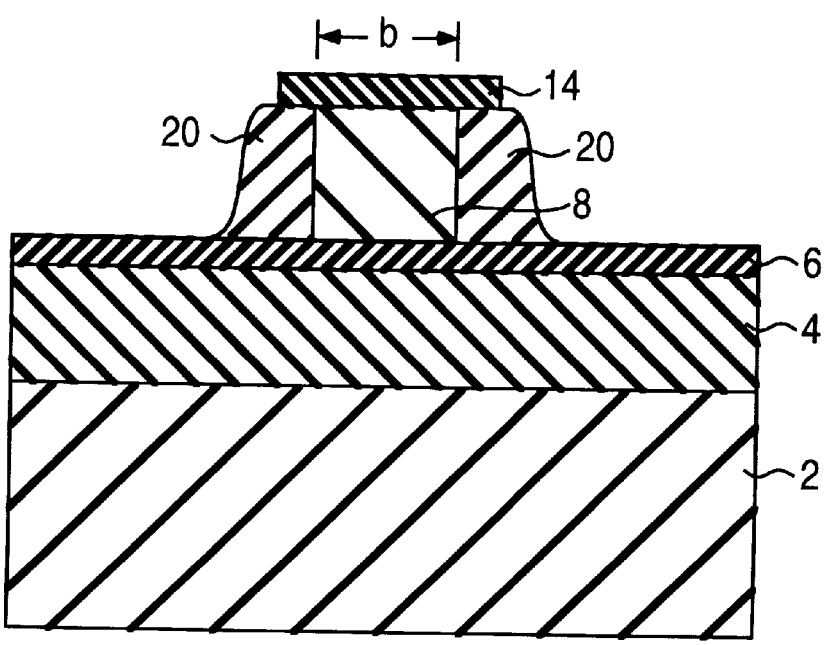
FIG. 4 is a sectional view of the MOS transistor portion of FIG. 3 after silicidizing the metal spacer layer with the polysilicon to form a metal silicide sidewall surrounding the polysilicon gate.

After the formation of the metal spacer layer 18 on the sidewall 12 of the polysilicon gate 8, a silicidation process at a low silicidation temperature is performed. For a Co spacer layer 18, the Co reacts with the polysilicon material in the polysilicon gate 8 to form cobalt disilicide (CoSi$_2$). After the metal is silicidized with the polysilicon, a metal silicide sidewall 20 is formed surrounding the polysilicon gate 8, as shown in FIG. 4. Although other metals can also be used, Co is well suited for the silicidation process because it can react with the polysilicon to form CoSi$_2$ at a relatively low silicidation temperature of about 600° C. A low temperature during the silicidation process is required to preserve the doping profiles in the channel, formed by the P$^+$-doped layer 2 and the P$^-$-doped layer 4 of the MOS transistor. An advantage of using Co as the metal for the silicidation process is that Co can react with the polysilicon at a low silicidation temperature of about 600° C. to form CoSi$_2$ without agglomeration or spiking, thereby preserving the doping profiles in the MOS transistor channel.

The time of silicidation is determined by the complete consumption of the metal, which depends on the thickness of the metal spacer layer 18 as shown in FIG. 3. The thickness of the conformal layer 16 in FIG. 2, which is the same as that of the metal spacer layer 18 in FIG. 3, determines the amount of the polysilicon in the polysilicon gate 8 to be silicidized, and therefore the thickness of the metal silicide sidewall 20 in FIG. 4. The polysilicon gate 8 now has a reduced gate length b and is surrounded by the metal silicide sidewall 20. The gate length b is determined by the thickness of the metal silicide sidewall 20, which is dependent upon the thickness of the metal spacer layer 18 in FIG. 3. It is expected that the reduced gate length b can be 0.05 μm or smaller.

In general, a thicker metal spacer layer 18 provides a larger amount of the metal to react with the polysilicon in the polysilicon gate 8 to form the metal silicide sidewall 20, thereby resulting in a shorter gate length b. Because the conformal metal layer 16 in FIG. 2 can be deposited with a precise thickness, usually within an accuracy of a few Å, by a CVD process which results in a highly uniform deposition of the metal on the sidewall 12 of the polysilicon gate 8, the thickness and shape of the metal silicide sidewall 20 in FIG. 4 after the silicidation process can be carefully controlled. Because one cobalt atom can at most react with two silicon atoms to form CoSi$_2$, and the supply of Co is limited by the thickness of the Co spacer layer 18, this silicidation process step is self-limiting and has a large process margin. Therefore, the size and shape of the polysilicon gate 8 with a reduced gate length b in FIG. 4 can be precisely controlled.

Figure 5:
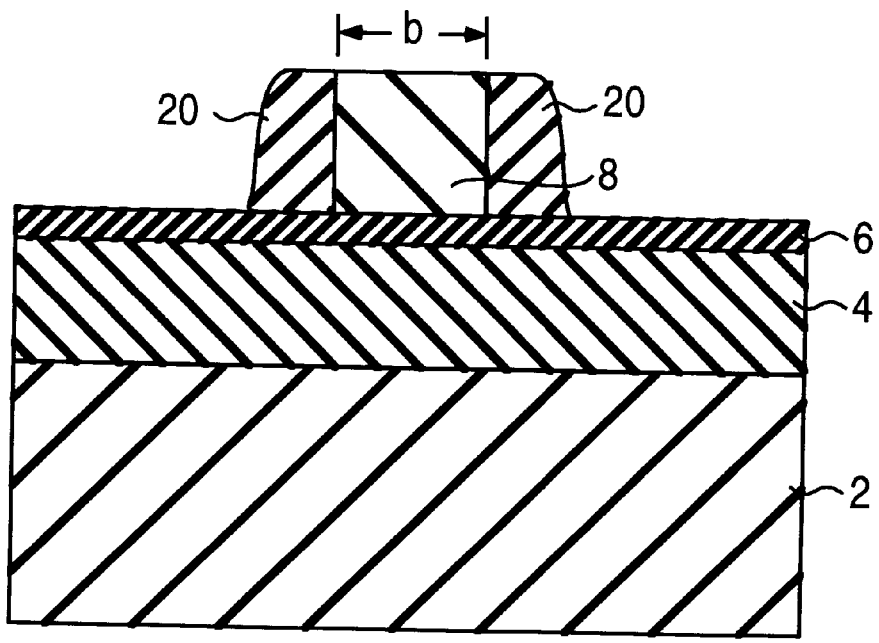
FIG. 5 is a sectional view of the MOS transistor portion of FIG. 4 after the cap layer is removed.

Subsequent to the silicidation process, the SiON cap layer 14 is removed by using a wet etch to strip the cap layer 14 from the polysilicon gate 8 and its surrounding metal silicide sidewall 20. The resulting MOS transistor without the SiON cap layer is shown in FIG. 5. An example of the wet etch used for stripping the SiON cap layer 14 is sulphuric acid ($H_2SO_4$), which removes only the SiON cap layer 14 while preserving the polysilicon gate 8, the metal silicide sidewall 20, and the gate oxide layer 6.

Figure 6:
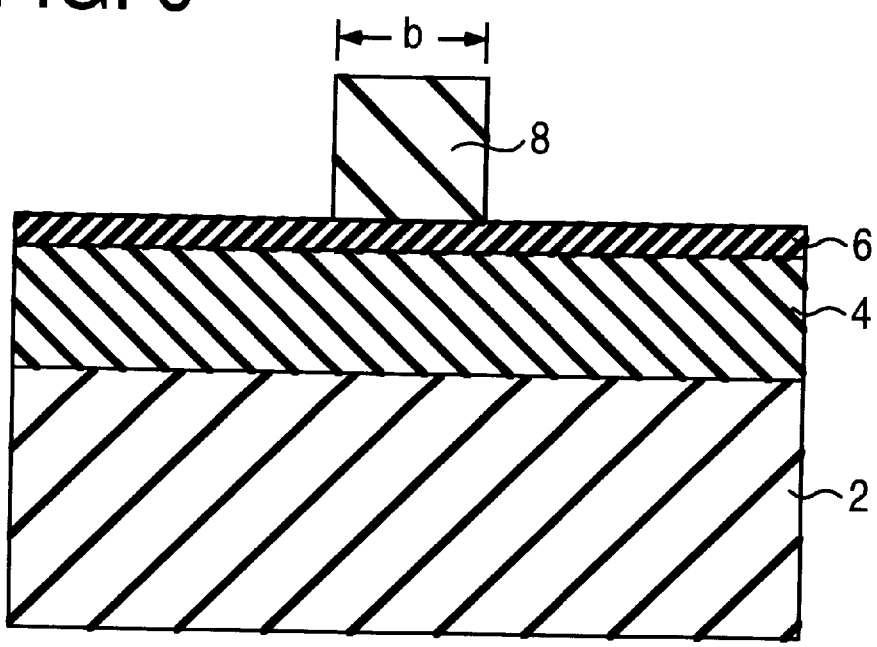
FIG. 6 is a sectional view of the MOS transistor portion of FIG. 5 after the metal silicide sidewall is removed.

The metal silicide sidewall 20 is then removed by wet etching with a selective wet etch. If Co is used in the silicidation process, the resulting $CoSi_2$ sidewall 20 surrounding the reduced-length polysilicon gate 8 is etched with hydrochloric acid (HCl) to leave a reduced-length polysilicon gate 8 as shown in FIG. 6. In a further embodiment, a boiling concentrated HCl solution is used to etch the $CoSi_2$ sidewall 20 because the HCl solution does not corrode the polysilicon gate 8 and the gate oxide layer 6. Subsequent to the process step of removing the metal silicide sidewall 20 in accordance with the present invention, further steps of fabricating a ULSI MOS integrated circuit are conventional and apparent to a person skilled in the art.

Figure 7:
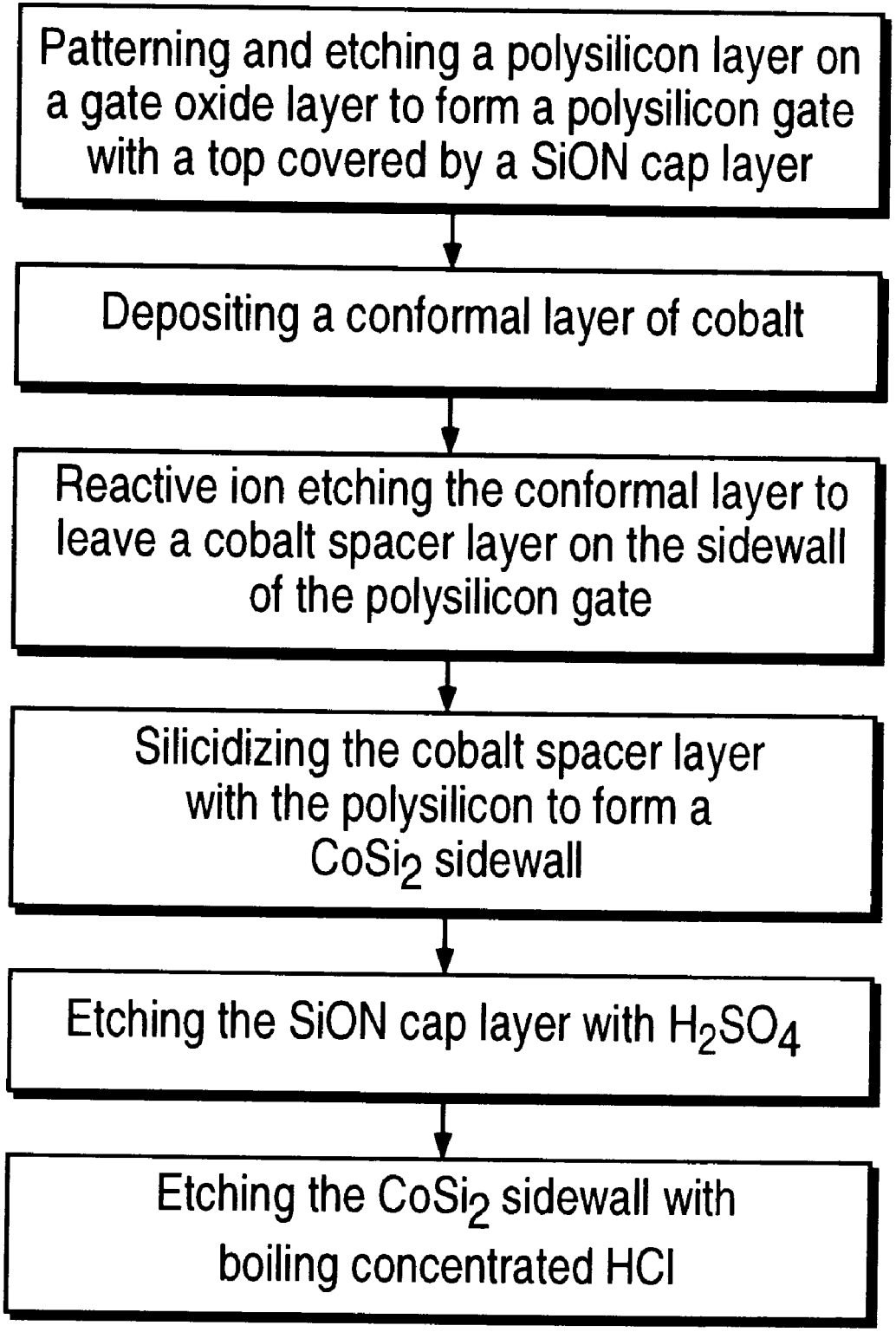
FIG. 7 is a block diagram showing an embodiment of the process of fabricating a polysilicon gate with a reduced gate size according to the present invention.

FIG. 7 is a block diagram showing an embodiment of the method according to the present invention with Co as the metal for silicidation, including the steps of:

patterning and etching a polysilicon layer on a gate oxide layer to form a polysilicon gate with a top covered by a SiON cap layer;

depositing a conformal layer of cobalt;

reactive ion etching the conformal layer to leave a cobalt spacer layer on the sidewall of the polysilicon gate;

silicidizing the cobalt spacer layer with the polysilicon to form a $CoSi_2$ sidewall;

etching the SiON cap layer with $H_2SO_4$; and etching the $CoSi_2$ sidewall with boiling concentrated HCl.

An advantage of using Co as the metal in the silicidation process is that it can react with polysilicon at a relatively low silicidation temperature of about 600° C. to form $CoSi_2$. Silicidation at this temperature would prevent agglomeration or spiking that would otherwise damage the MOS transistor. A further advantage of using Co is that $CoSi_2$ can be selectively etched by using boiling concentrated HCl, which does not react with the $SiO_2$ in the gate oxide layer 6 or the polysilicon in the polysilicon gate 8. Other metals such as Ni, Ti, Cr and Mo can also be used for the silicidation process.

INDUSTRIAL APPLICABILITY

The method according to the present invention is applicable for the fabrication of MOS transistor integrated circuits, and more particularly, to ultra large scale integration (ULSI) circuits with a small transistor feature size. The method is believed to be superior to the photoresist trimming technology which is widely used at the present time for advanced device research. The gate length of the polysilicon gate can be reduced to 0.05 μm or smaller. The controllability of the size and shape of the polysilicon gate is expected to be better than that of the photoresist trimming process.

The invention has been described with respect to particular embodiments thereof, and numerous modifications can be made which are within the scope of the invention as set forth in the claims.

What is claimed is:

1. A method of fabricating a polysilicon gate of a metal oxide semiconductor (MOS) transistor, comprising the steps of:

(a) providing a polysilicon gate on a gate oxide layer, the polysilicon gate having a top and a sidewall;

(b) forming a conformal layer of a metal on the polysilicon gate and the gate oxide layer;

(c) removing a portion of the conformal layer to leave a spacer layer of the metal on the sidewall of the polysilicon gate;

(d) forming a metal silicide sidewall surrounding the polysilicon gate by silicidizing the metal spacer layer with the polysilicon; and (e) removing the metal silicide sidewall from the polysilicon gate, thereby reducing the size of the polysilicon gate.

2. The method of claim 1, wherein the metal comprises cobalt (Co).

3. The method of claim 2, wherein the metal silicide comprises cobalt disilicide ($CoSi_2$).

4. The method of claim 1, wherein the metal comprises nickel (Ni).

5. The method of claim 1, wherein the metal comprises titanium (Ti).

6. The method of claim 1, wherein the metal comprises chromium (Cr).

7. The method of claim 1, wherein the metal comprises molybdenum (Mo).

8. The method of claim 1, further comprising providing a cap layer on the top of the polysilicon gate prior to the depositing of the conformal layer.

9. The method of claim 8, wherein the cap layer comprises silicon nitride oxide (SiON).

10. The method of claim 8, wherein the forming of the conformal layer further includes depositing the metal on the cap layer.

11. The method of claim 8, further comprising removing the cap layer subsequent to the silicidizing of the metal spacer layer.

12. The method of claim 1, wherein the removing of the metal silicide sidewall includes etching the metal silicide sidewall.

13. The method of claim 12, wherein the metal silicide sidewall is etched with a selective wet etch.

14. The method of claim 13, wherein the selective wet etch comprises hydrochloric acid (HCl).

15. The method of claim 14, wherein the selective wet etch comprises boiling concentrated HCl.

16. The method of claim 1, wherein the removing of the portion of the conformal layer comprises reactive ion etching (RIE) the conformal layer.

17. The method of claim 16, wherein the RIE of the conformal layer comprises RIE with an anisotropic etch.

18. The method of claim 1, wherein the metal spacer layer is silicidized at a temperature of about 600° C.

19. The method of claim 1, wherein the providing of the polysilicon gate includes patterning and etching a polysilicon layer on the gate oxide layer.

20. The method of claim 1, wherein the gate oxide layer comprises silicon dioxide ($SiO_2$).

21. A method of fabricating a polysilicon gate of a metal oxide semiconductor (MOS) transistor, comprising the steps of:

(a) patterning and etching a polysilicon layer on a gate oxide layer to form a polysilicon gate having a top and a sidewall;

(b) providing a cap layer on the top of the polysilicon gate;

(c) depositing a conformal layer of a metal on the polysilicon gate, the gate oxide layer and the cap layer;

(d) etching the conformal layer to leave a spacer layer of the metal on the sidewall of the polysilicon gate;

(e) silicidizing the metal spacer layer with the polysilicon to form a metal silicide sidewall surrounding the polysilicon gate;

(f) removing the cap layer; and (g) etching the metal silicide sidewall to remove the metal silicide from the polysilicon gate, thereby reducing the size of the polysilicon gate.

22. The method of claim 21, wherein the metal comprises cobalt (Co).

23. The method of claim 22, wherein the metal silicide comprises cobalt disilicide ($CoSi_2$).

24. The method of claim 21, wherein the metal comprises nickel (Ni).

25. The method of claim 21, wherein the metal comprises titanium (Ti).

26. The method of claim 21, wherein the metal comprises chromium (Cr).

27. The method of claim 21, wherein the metal comprises molybdenum (Mo).

28. The method of claim 21, wherein the metal silicide sidewall is etched with a selective wet etch.

29. The method of claim 28, wherein the selective wet etch comprises hydrochloric acid (HCl).

30. The method of claim 29, wherein the selective wet etch comprises boiling concentrated HCl.

31. The method of claim 21, wherein the etching of the conformal layer comprises reactive ion etching (RIE).

32. The method of claim 31, wherein the etching of the conformal layer comprises RIE with an anisotropic etch using the cap layer as an etch stop.

33. The method of claim 21, wherein the metal spacer layer is silicidized at a temperature of about 600° C.

34. The method of claim 21, wherein the cap layer comprises silicon nitride oxide (SiON).

35. A method of fabricating a polysilicon gate of a metal oxide semiconductor (MOS) transistor, comprising the steps of:

(a) patterning and etching a polysilicon layer on a gate oxide layer to form a polysilicon gate having a top and a sidewall;

(b) depositing a conformal layer of cobalt (Co) on the polysilicon gate and the gate oxide layer;

(c) etching the conformal layer to leave a spacer layer of Co on the sidewall of the polysilicon gate;

(d) silicidizing the Co spacer layer with the polysilicon at a low silicidation temperature to form a cobalt disilicide ($CoSi_2$) sidewall surrounding the polysilicon gate; and (e) etching the $CoSi_2$ sidewall to remove the $CoSi_2$ from the polysilicon gate, thereby reducing the size of the polysilicon gate.

36. The method of claim 35, further comprising providing a cap layer on the top of the polysilicon gate prior to the depositing of the conformal layer.

37. The method of claim 36, wherein the cap layer comprises silicon nitride oxide (SiON).

38. The method of claim 36, wherein the depositing of the conformal layer further includes depositing the Co on the cap layer.

39. The method of claim 36, further comprising removing the cap layer subsequent to the silicidizing of the Co spacer layer.

40. The method of claim 35, wherein the $CoSi_2$ sidewall is etched with a selective wet etch.

41. The method of claim 40, wherein the selective wet etch comprises hydrochloric acid (HCl).

42. The method of claim 41, wherein the selective wet etch comprises boiling concentrated HCl.

43. The method of claim 35, wherein the etching of the conformal layer comprises reactive ion etching (RIE).

44. The method of claim 43, wherein the etching of the conformal layer comprises RIE with an anisotropic etch.

45. The method of claim 35, wherein the low silicidation temperature is about 600° C.

46. A method of fabricating a polysilicon gate of a metal oxide semiconductor (MOS) transistor, comprising the steps of:

(a) patterning and etching a polysilicon layer on a gate oxide layer to form a polysilicon gate having a top and a sidewall;

(b) providing a silicon nitride oxide (SiON) cap layer on the top of the polysilicon gate;

(c) depositing a conformal layer of cobalt (Co) on the polysilicon gate, the gate oxide layer and the SiON cap layer;

(d) etching the conformal layer to leave a spacer layer of Co on the sidewall of the polysilicon gate;

(e) silicidizing the Co spacer layer with the polysilicon at a low silicidation temperature to form a cobalt disilicide ($CoSi_2$) sidewall surrounding the polysilicon gate;

(f) removing the SiON cap layer; and (g) etching the $CoSi_2$ sidewall to remove the $CoSi_2$ from the polysilicon gate, thereby reducing the size of the polysilicon gate.

47. The method of claim 46, wherein the $CoSi_2$ sidewall is etched with a selective wet etch.

48. The method of claim 47, wherein the selective wet etch comprises hydrochloric acid (HCl).

49. The method of claim 48, wherein the selective wet etch comprises boiling concentrated HCl.

50. The method of claim 46, wherein the etching of the conformal layer comprises reactive ion etching (RIE).

51. The method of claim 50, wherein the etching of the conformal layer comprises RIE with an anisotropic etch using the SiON cap layer as an etch stop.

52. The method of claim 46, wherein the low silicidation temperature is about 600° C.

53. A method of fabricating a polysilicon gate of a metal oxide semiconductor (MOS) transistor, comprising the steps of:

(a) patterning and etching a polysilicon layer on a gate oxide layer to form a polysilicon gate having a top and a sidewall;

(b) depositing a conformal layer of cobalt (Co) on the polysilicon gate and the gate oxide layer by chemical vapor deposition (CVD);

(c) reactive ion etching the conformal layer with an anisotropic etch to leave a spacer layer of Co on the sidewall of the polysilicon gate;

(d) silicidizing the Co spacer layer with the polysilicon at a temperature of about 600° C. to form a cobalt disilicide ($CoSi_2$) sidewall surrounding the polysilicon gate; and (e) etching the $CoSi_2$ sidewall with hydrochloric acid (HCl) to remove the $CoSi_2$ from the polysilicon gate, thereby reducing the size of the polysilicon gate.

54. The method of claim 53, further comprising providing a cap layer on the top of the polysilicon gate prior to the depositing of the conformal layer.

55. The method of claim 54, wherein the cap layer comprises silicon nitride oxide (SiON).

56. The method of claim 54, wherein the depositing of the conformal layer further includes depositing the Co on the cap layer.

57. The method of claim 54, further comprising etching the cap layer with sulfuric acid ($H_2SO_4$) to remove the cap layer from the polysilicon gate subsequent to the silicidizing of the Co spacer layer.

58. A method of fabricating a polysilicon gate of a metal oxide semiconductor (MOS) transistor, comprising the steps of:

(a) patterning and etching a polysilicon layer on a gate oxide layer to form a polysilicon gate having a top and a sidewall;

(b) providing a silicon nitride oxide (SiON) cap layer on the top of the polysilicon gate;

(c) depositing a conformal layer of cobalt (Co) on the polysilicon gate, the gate oxide layer and the SiON cap layer by chemical vapor deposition (CVD);

(d) reactive ion etching the conformal layer with an anisotropic etch using the SiON cap layer as an etch stop to leave a spacer layer of Co on the sidewall of the polysilicon gate;

(e) silicidizing the Co spacer layer with the polysilicon at a temperature of about 600° C. to form a cobalt disilicide ($CoSi_2$) sidewall surrounding the polysilicon gate;

(f) etching the SiON cap layer with sulfuric acid ($H_2SO_4$) to remove the SiON cap layer from the polysilicon gate; and (g) etching the $CoSi_2$ sidewall with boiling concentrated hydrochloric acid (HCl) to remove the $CoSi_2$ from the polysilicon gate, thereby reducing the size of the polysilicon gate.

* * * * *